(12) United States Patent
Lewis et al.

(10) Patent No.: US 8,818,295 B2
(45) Date of Patent: Aug. 26, 2014

(54) HIGH AND LOW SPEED SERIAL INTERFACE MULTIPLEXING CIRCUIT

(75) Inventors: Patrick S. Lewis, Sahuarita, AZ (US); Douglas P. Gugler, Sahuarita, AZ (US)

(73) Assignee: Raytheon Company, Waltham, MA (US)

( * ) Notice: Subject to any disclaimer, the term of this patent is extended or adjusted under 35 U.S.C. 154(b) by 269 days.

(21) Appl. No.: 13/344,181

(22) Filed: Jan. 5, 2012

(65) Prior Publication Data

US 2012/0194292 A1 Aug. 2, 2012

Related U.S. Application Data

(60) Provisional application No. 61/437,981, filed on Jan. 31, 2011.

(51) Int. Cl.
*H04B 1/38* (2006.01)
*H04B 1/44* (2006.01)

(52) U.S. Cl.
USPC ............... 455/73; 455/78; 370/276; 370/284

(58) Field of Classification Search
None
See application file for complete search history.

(56) References Cited

U.S. PATENT DOCUMENTS

| | | | |
|---|---|---|---|
| 3,836,720 A * | 9/1974 | Getgen | 370/308 |
| 5,267,322 A | 11/1993 | Smith et al. | |
| 5,838,722 A * | 11/1998 | Consi | 375/219 |
| 6,212,415 B1 * | 4/2001 | Demuro et al. | 455/575.7 |
| 6,563,381 B1 * | 5/2003 | Strong | 330/253 |
| 7,286,026 B2 * | 10/2007 | Law | 333/124 |
| 7,372,807 B2 * | 5/2008 | Ohira et al. | 370/223 |
| 7,869,771 B2 * | 1/2011 | Zolfaghari | 455/78 |
| 8,014,416 B2 * | 9/2011 | Ho et al. | 370/431 |
| 2005/0073586 A1 | 4/2005 | Li et al. | |
| 2010/0265189 A1 | 10/2010 | Rofougaran | |
| 2011/0319042 A1 * | 12/2011 | Soman | 455/205 |

FOREIGN PATENT DOCUMENTS

| | | |
|---|---|---|
| EP | 0756785 B2 | 1/2006 |
| WO | WO-2012106059 A1 | 8/2012 |

OTHER PUBLICATIONS

"International Application Serial No. PCT/US2012/020308, International Preliminary Report on Patentability mailed Aug. 15, 2013", 8 pgs.
"International Application Serial No. PCT/US2012/020308, Search Report mailed Apr. 4, 2012", 2 pgs.
"International Application Serial No. PCT/US2012/020308, Written Opinion mailed Apr. 4, 2012", 6 pgs.

* cited by examiner

*Primary Examiner* — Temesgh Ghebretinsae
*Assistant Examiner* — Dong-Chang Shiue
(74) *Attorney, Agent, or Firm* — Schwegman Lundberg & Woessner, P.A.

(57) ABSTRACT

A high and low speed serial interface multiplexing circuit includes a low speed transceiver, a high speed transceiver, an inductor coupled to a communication interface port of the low speed transceiver, a capacitor coupled to a communication interface port of the high speed transceiver, and a transformer coupled to the communication interface port of the high speed transceiver.

15 Claims, 1 Drawing Sheet

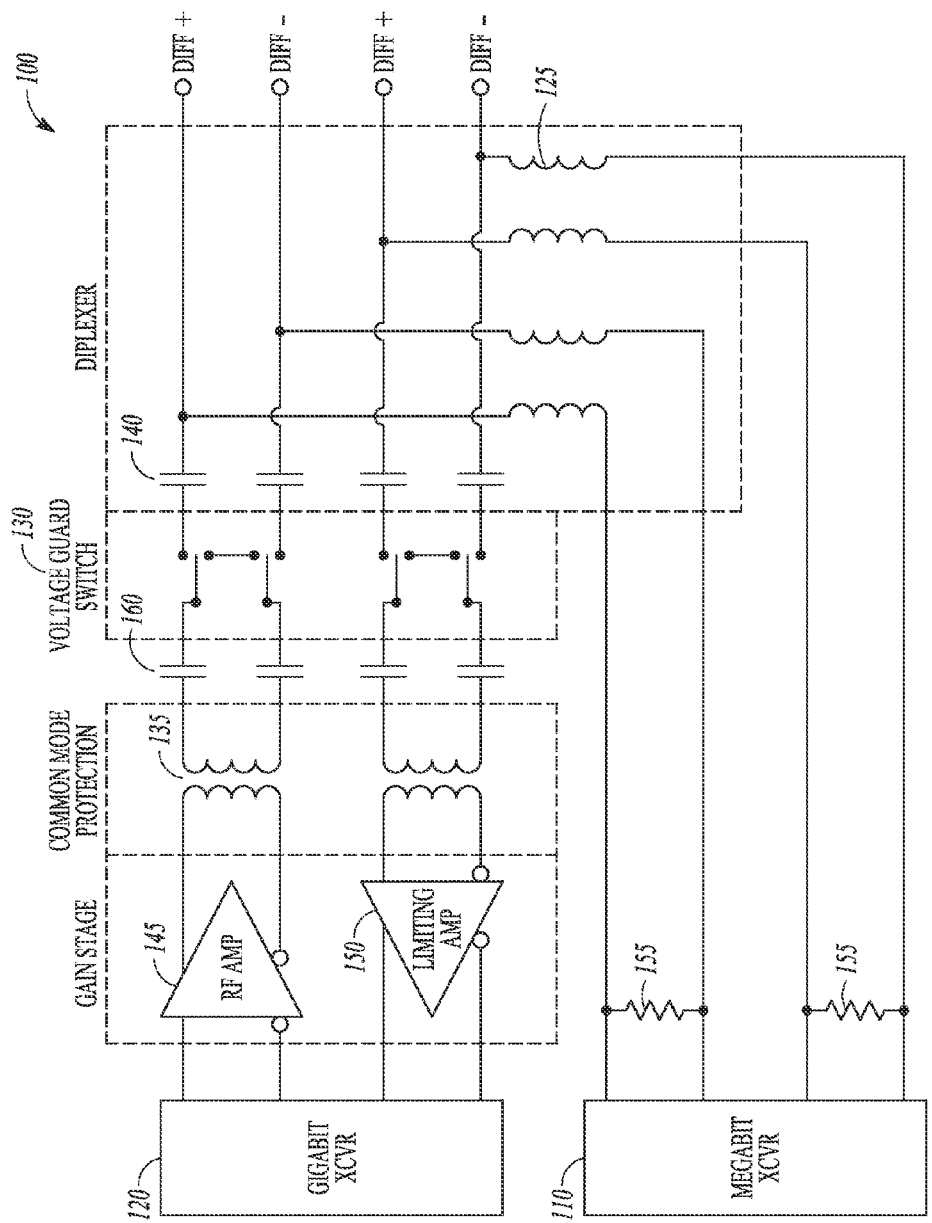

HIGH AND LOW SPEED SERIAL INTERFACE MULTIPLEXING CIRCUIT

CLAIM OF PRIORITY

This patent application claims the benefit of priority, under 35 U.S.C. §119(e), to U.S. Provisional Patent Application Ser. No. 61/437,981, entitled HIGH AND LOW SPEED SERIAL INTERFACE MULTIPLEXING CIRCUIT, which was filed on Jan. 31, 2011, and which is hereby incorporated by reference herein in its entirety.

TECHNICAL FIELD

The present disclosure relates to a high and low speed serial interface multiplexing circuit, and in an embodiment, but not by way of limitation, a high and low speed serial interface multiplexing circuit that addresses the issue wherein voltage levels on the low speed signal could damage the lower voltage and more sensitive high speed interface drivers.

BACKGROUND

Upgrading an information technology (IT) system often requires backward compatibility. For example, a system originally implemented with a 1 Mbit/sec serial interface may be upgraded to include an interface of 1 Gbit/sec. In some circumstances, the system may be required to transmit the lower and higher speed transmissions over the same physical medium. However, the low speed and high speed interfaces may be incompatible with each other. In certain circumstances, such lower speed signals could possibly damage the high speed interfaces.

BRIEF DESCRIPTION OF THE DRAWING

FIG. 1 is a block diagram of a high and low speed serial interface multiplexing circuit.

DETAILED DESCRIPTION

In the following detailed description, reference is made to the accompanying drawing that shows, by way of illustration, a specific embodiment in which the invention may be practiced. This embodiment is described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled.

FIG. 1 illustrates an embodiment of a circuit 100 that can handle both low and high speed serial data transmissions. The circuit 100 includes a low speed transceiver 110 and a high speed transceiver 120. In FIG. 1, the low speed transceiver 110 is indicated as a megabit transceiver, and the high speed transceiver 120 is indicated as a gigabit transceiver, but other relative low and high speeds are applicable to the present disclosure. The low speed transceiver 110 is selected such that it can handle significant amounts of common mode voltage, for example, in a range of −12 to +12 V. While the low speed and high speed interfaces may be similar in signaling mode (differential), they can be different in other features such as baud rate, impedance, coupling (DC vs. AC), and common mode voltage tolerance. Coupled to the low speed transceiver 110 are inductors 125. In an embodiment, termination resistors 155 are coupled in parallel to the low speed interface 110. A switch 130, capacitor 140, and transformer 135 are coupled to the high speed transceiver 120. The configuration of the inductors 125 and the capacitors 140 form a single-pole multiplexer. A second capacitor 160 can be positioned between the switch 130 and the transformer 135. In an embodiment, the high speed transceiver 120 further has coupled to it an RF amplifier 145 and a differential voltage limiting amplifier 150. The circuit 100 includes no solid state relays because of the need to maintain bias over the full common mode range. The circuit 100 further includes no electromechanical RF relays because they are too large for one or more particular applications. However, in other applications, if space permitted, the diplexer and RF switch could be replaced with an RF electromechanical relay. The RF switch could also be replaced by appropriately biased discrete PIN diodes.

In the circuit 100 of FIG. 1, the inductors 125 are placed in front of the low speed transceivers since the low speed transceivers require the presence of a DC bias. The inductors are sized so that they provide high impedance to the high frequency signals (the impedance on the slow side of the circuit is less significant). The capacitor 140 is placed in front of the high speed transceivers to act as a high pass filter and block the DC bias voltages of the lower speed interface. The capacitor 160 is for filtering the low frequency components of the signals.

In an embodiment, the switch 130 is an RF switch, and it is coupled to the high speed capacitor 140. The RF switch presents an open circuit to the low speed interface when the high speed interface is not in use. This configuration maintains the signal integrity of the low speed signals, and protects the high speed interface from high frequency content in the low speed signals whose amplitude may exceed the rated voltage of the high speed transceiver.

In an embodiment, the distance between the inductor 125 and the switch 130 can be important and is a function of a signal rise/fall time of a high speed signal. Specifically, the primary path for low speed signals is through the inductor 125. Therefore, any length of trace between the inductor 125 and the switch 130 can be classified as a "stub," which can degrade the low speed signal's integrity. The distance between the inductor 125 and the switch 130 should be less than a twentieth of a wavelength. For example, in determining the distance between the inductor 125 and the switch 130, if the 10% to 90% rise time is 500 picoseconds, then it would be expected that the frequency content of the signal would be less than $0.35/0.5$ ns=700 MHz. Assuming an FR-4 material with an $\epsilon_r$ equal to 4.3, the resulting wavelength would be 3.0e8/sqrt(4.3)/700 MHz=0.21 m or 8.13 in. So the distance in this example between the inductor 125 and switch 130 should be less than one twentieth of that, or around 0.41 inches.

Stubs for the high speed interface should be minimized as well. From the perspective of the high speed interface, the path through the switch 130 is the desired path. The physical pad of the inductor 125 should therefore be in the path of the high speed signal so as to minimize any stubs. That is, it could be desirable to ensure that the distance from the main circuit trace that enters the DIFF+/−ports (See FIG. 1) to the pad of the inductor is less than one tenth the wavelength of the high speed signal.

The transformer 135 positioned behind the RF switch serves to protect the transceivers 110, 120 against (high frequency) common mode noise that may be present when the high speed interface is enabled, that is, the transformer 135 provides common mode protection and ground isolation on the high speed interface. The RF amplifier 145 that is placed at the output of the high speed transceiver 120 overcomes high speed channel losses including those of the transformer 135. The differential voltage limiting amplifier 150 is placed at the high speed receiver 120 to detect heavily attenuated input signals and to again compensate for potential losses through the transformer 135.

The circuit 100 can handle considerable common mode and differential voltages on the low speed transceivers without damaging the high speed transceivers, thereby allowing for seamless operation at lower and higher frequencies. The circuit 100 also protects the high speed transceivers from low frequency transmissions with very high rise times without signal integrity degradation. With well-selected amplifiers 145 and 150, the circuit 100 can enhance an off-the-shelf transceiver such that it can detect differential signals with peak-to-peak voltages as low as 13 mV, and it can enhance high speed transmitters such that they can meet a wide range of transmitted signal requirements, such as, in an embodiment, an output of approximately 1.8 V differential peak-to-peak with minimal distortion.

EXAMPLE EMBODIMENTS

Example No. 1 is a multiplexing circuit for a low and high speed serial interface. The circuit includes a low speed transceiver, a high speed transceiver, an inductor coupled to a communication interface port of the low speed transceiver, a capacitor coupled to a communication interface port of the high speed transceiver, and a transformer coupled to the switch and the communication interface port of the high speed transceiver.

Example No. 2 includes the features of Example No. 1, and optionally includes a switch coupling the capacitor and the high speed interface.

Example No. 3 includes the features of Example Nos. 1-2, and optionally includes a circuit wherein the communication interface port of the low speed interface and the communication interface port of the high speed interface are the same physical medium.

Example No. 4 includes the features of Example Nos. 1-3, and optionally includes a circuit wherein a distance between the inductor and the switch is a function of a signal rise/fall time of a low speed signal.

Example No. 5 includes the features of Example Nos. 1-4, and optionally includes a circuit wherein a distance between the capacitor and the inductor is a function of a signal rise/fall time of a high speed signal.

Example No. 6 includes the features of Example Nos. 1-5, and optionally includes an RF amplifier coupled to the communication interface port of the high speed transmitter.

Example No. 7 includes the features of Example Nos. 1-6, and optionally includes a differential limiting voltage amplifier coupled to the communication interface port of the high speed receiver.

Example No. 8 includes the features of Example Nos. 1-7, and optionally includes a capacitor coupling the switch to the transformer.

Example No. 9 includes the features of Example Nos. 1-8, and optionally includes a circuit wherein the switch is an RF switch.

Example No. 10 includes the features of Example Nos. 1-9, and optionally includes a resistor coupled in parallel to the communication interface port of the low speed transceiver, or a resistor serving as an appropriate termination on the high speed serial interface at either the transceiver or at the input to the receiving amplifier.

Example No. 11 includes the features of Example Nos. 1-10, and optionally includes a circuit wherein the low speed transceiver comprises a serial communication interface whose speed is several orders of magnitude less than the high speed transceiver.

Example No. 12 includes the features of Example Nos. 1-11, and optionally includes a circuit wherein the low speed transceiver comprises an approximately 1 megabit per second serial communication interface.

Example No. 13 includes the features of Example Nos. 1-12, and optionally includes a circuit wherein the high speed transceiver comprises a serial communication interface whose speed is several orders of magnitude more than the low speed transceiver.

Example No. 14 includes the features of Example Nos. 1-13, and optionally includes a circuit wherein the high speed transceiver comprises an approximately 1 gigabit per second serial communication interface.

Example No. 15 includes the features of Example Nos. 1-14, and optionally includes a circuit wherein the low speed transceiver is configured to output a differential voltage that is greater than a differential voltage that can be tolerated by the high speed transceiver.

Example No. 16 includes the features of Example Nos. 1-15, and optionally includes a circuit wherein the low speed transceiver is configured to output up to 6 volts differentially.

Example No. 17 includes the features of Example Nos. 1-16, and optionally includes a circuit wherein the low speed transceiver is configured to receive a common mode voltage much larger than a common mode voltage that can be tolerated by the high speed transceiver.

Example No. 18 includes the features of Example Nos. 1-17, and optionally includes a circuit wherein the low speed transceiver is configured to receive a common mode voltage of +/−12 volts.

In the foregoing detailed description of embodiments of the invention, various features are grouped together in one or more embodiments for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

The Abstract is provided to comply with 37 C.F.R. 1.72(b) to allow a reader to quickly ascertain the nature and gist of the technical disclosure. The Abstract is submitted with the understanding that it will not be used to interpret or limit the scope or meaning of the claims.

The invention claimed is:

1. A circuit comprising:
    a low speed transceiver;
    a high speed transceiver;
    an inductor coupled to a communication interface port of the low speed transceiver;
    a capacitor coupled to the inductor and a communication interface port of the high speed transceiver;
    a transformer coupled to the communication interface port of the high speed transceiver; and
    a switch coupling the capacitor and the high speed transceiver;
    wherein a distance between the inductor and the switch is a function of a signal rise/fall time of a low speed signal or a distance between the capacitor and the inductor is a function of a signal rise/fall time of a high speed signal.

2. The circuit of claim 1, comprising a second capacitor coupling the switch to the transformer.

3. The circuit of claim 1, wherein the switch comprises an RF switch.

4. The circuit of claim 1, wherein the communication interface port of the low speed interface and the communication interface port of the high speed interface comprise the same physical medium.

5. The circuit of claim 1, comprising an RF amplifier coupled to the communication interface port of the high speed transmitter.

6. The circuit of claim 5, comprising one or more of a termination resistor coupled in parallel to the communication interface port of the low speed transceiver or a resistor configured to serve as an appropriate termination on the high speed serial interface at either the transceiver or at the input to the RF amplifier.

7. The circuit of claim 1, comprising a differential limiting voltage amplifier coupled to the communication interface port of the high speed receiver.

8. The circuit of claim 1, wherein the low speed transceiver comprises a serial communication interface whose speed is several orders of magnitude less than the high speed transceiver.

9. The circuit of claim 8, wherein the low speed transceiver comprises an approximately 1 megabit per second serial communication interface.

10. The circuit of claim 1, wherein the high speed transceiver comprises a serial communication interface whose speed is several orders of magnitude greater than the low speed transceiver.

11. The circuit of claim 10, wherein the high speed transceiver comprises an approximately 1 gigabit per second serial communication interface.

12. The circuit of claim 1, wherein the low speed transceiver is configured to output a differential voltage that is greater than a differential voltage that can be tolerated by the high speed transceiver.

13. The circuit of claim 12, wherein the low speed transceiver is configured to output up to 6 volts differentially.

14. The circuit of claim 1, wherein the low speed transceiver is configured to receive a common mode voltage substantially larger than a common mode voltage that can be tolerated by the high speed transceiver.

15. The circuit of claim 14, wherein the low speed transceiver is configured to receive a common mode voltage of +/−12 volts.

* * * * *

UNITED STATES PATENT AND TRADEMARK OFFICE
CERTIFICATE OF CORRECTION

| | | |
|---|---|---|
| PATENT NO. | : 8,818,295 B2 | Page 1 of 1 |
| APPLICATION NO. | : 13/344181 | |
| DATED | : August 26, 2014 | |
| INVENTOR(S) | : Lewis et al. | |

It is certified that error appears in the above-identified patent and that said Letters Patent is hereby corrected as shown below:

In the Specification,

In column 2, line 9, delete "interface" and insert --transceiver--, therefor

In column 3, line 13, delete "receiver" and insert --transceiver--, therefor

Signed and Sealed this
Twenty-fifth Day of November, 2014

Michelle K. Lee
*Deputy Director of the United States Patent and Trademark Office*